(12) United States Patent
Chang et al.

(10) Patent No.: US 12,295,178 B2
(45) Date of Patent: May 6, 2025

(54) IMAGE SENSOR

(71) Applicant: VisEra Technologies Company Limited, Hsin-Chu (TW)

(72) Inventors: Yuan-Shuo Chang, Taichung (TW); Ching-Chiang Wu, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 383 days.

(21) Appl. No.: 17/152,288

(22) Filed: Jan. 19, 2021

(65) Prior Publication Data
US 2022/0231074 A1 Jul. 21, 2022

(51) Int. Cl.
H01L 27/14 (2006.01)
H10F 39/00 (2025.01)
H10F 39/18 (2025.01)

(52) U.S. Cl.
CPC ......... *H10F 39/18* (2025.01); *H10F 39/8053* (2025.01); *H10F 39/8063* (2025.01)

(58) Field of Classification Search
CPC ......... H01L 27/14643; H01L 27/14621; H01L 27/14627
See application file for complete search history.

(56) References Cited

U.S. PATENT DOCUMENTS

| | | | |
|---|---|---|---|
| 8,698,266 B2 | 4/2014 | Lee et al. | |
| 2010/0140453 A1* | 6/2010 | Kikuchi | H01L 27/14603 257/E31.127 |
| 2011/0102651 A1 | 5/2011 | Tay | |
| 2014/0197301 A1* | 7/2014 | Velichko | H04N 23/689 250/208.1 |
| 2015/0216486 A1* | 8/2015 | Moriyasu | A61B 6/44 600/436 |
| 2017/0366770 A1* | 12/2017 | Yokogawa | H04N 25/134 |
| 2018/0114806 A1* | 4/2018 | Kim | H01L 27/1463 |
| 2019/0096945 A1 | 3/2019 | Lu et al. | |

(Continued)

FOREIGN PATENT DOCUMENTS

| | | | |
|---|---|---|---|
| CN | 101201539 A | 6/2008 | |
| CN | 104103653 A | 10/2014 | |

(Continued)

OTHER PUBLICATIONS

Office Action mailed Jan. 4, 2022 in TW Application No. 110109304, 7 pages.

*Primary Examiner* — Nicholas J Tobergte
*Assistant Examiner* — Adin Hrnjic
(74) *Attorney, Agent, or Firm* — MUNCY, GEISSLER, OLDS & LOWE. P.C.

(57) ABSTRACT

An image sensor is provided. The image sensor includes a substrate, first photodiodes, second photodiodes, an interlayer, a light-guiding structure, and a micro-lens layer. The first photodiodes and the second photodiodes are alternately disposed in the substrate. The area of each of the first photodiodes is less than the area of each of the second photodiodes from a top view. The interlayer is disposed on the substrate. The light-guiding structure is disposed in the interlayer and over at least one of the first photodiodes or the second photodiodes. The refractive index of the light-guiding structure is greater than the refractive index of the interlayer. The micro-lens layer is disposed on the interlayer.

19 Claims, 8 Drawing Sheets

(56) References Cited

U.S. PATENT DOCUMENTS

| | | | |
|---|---|---|---|
| 2019/0333953 A1* | 10/2019 | Zhao | H01L 27/14629 |
| 2021/0028212 A1* | 1/2021 | Chang | H01L 27/14629 |
| 2021/0233947 A1* | 7/2021 | Zang | H01L 27/14605 |
| 2022/0066309 A1* | 3/2022 | Ootsuka | G02B 5/208 |

FOREIGN PATENT DOCUMENTS

| | | |
|---|---|---|
| CN | 106257679 A | 12/2016 |
| CN | 108269811 A | 7/2018 |
| JP | 2010062438 A | 3/2010 |
| JP | 2010129548 A | 6/2010 |
| JP | 2013510424 A | 3/2013 |
| KR | 1020030001111 | 1/2003 |
| KR | 1020110073605 | 6/2011 |
| TW | 201630177 A | 8/2016 |
| WO | WO-2016098640 A1 | 6/2016 |
| WO | WO-2020149207 A1 * | 7/2020 ........... G02B 3/0056 |

\* cited by examiner

IMAGE SENSOR

BACKGROUND

Technical Field

The present disclosure relates in general to an image sensor, and in particular, it relates to an image sensor providing high dynamic range (HDR).

Description of the Related Art

Image sensors, such as complementary metal oxide semiconductor (CMOS) image sensors (also known as CIS), are widely used in various image-capturing apparatus such as digital still-image cameras, digital video cameras, and the like. The light-sensing portion of the image sensor may detect ambient color change, and signal electric charges may be generated depending on the amount of light received in the light-sensing portion. In addition, the signal electric charges generated in the light-sensing portion may be transmitted and amplified, to obtain an image signal.

Image sensors should be able to capture images quickly, and the accuracy, spatial resolution, and dynamic range must be as high as possible. However, conventional imaging sensors face the problem of missing scene detail or blurring or severe distortion due to the limited dynamic range. Therefore, image sensors capable of achieving high dynamic range (HDR) imaging are called for.

SUMMARY

In accordance with some embodiments of the disclosure, an image sensor is provided. The image sensor includes a substrate, first photodiodes, second photodiodes, an interlayer, a light-guiding structure, and a micro-lens layer. The first photodiodes and the second photodiodes are alternately disposed in the substrate. The area of each of the first photodiodes is less than the area of each of the second photodiodes from a top view. The interlayer is disposed on the substrate. The light-guiding structure is disposed in the interlayer and over at least one of the first photodiodes or the second photodiodes. The refractive index of the light-guiding structure is greater than the refractive index of the interlayer. The micro-lens layer is disposed on the interlayer.

In accordance with some other embodiments of the disclosure, another image sensor is also provided. The image sensor includes a substrate, first photodiodes, second photodiodes, an interlayer, a light-guiding structure, a color filter array, and a micro-lens layer. The first photodiodes and the second photodiodes are alternately disposed in the substrate. The area of each of the first photodiodes is less than the area of each of the second photodiodes from a top view. The interlayer is disposed on the substrate. The light-guiding structure is disposed in the interlayer and over at least one of the first photodiodes or the second photodiodes. The color filter array has a plurality of color filters disposed on the interlayer. The micro-lens layer is disposed on the color filter array, and includes a plurality of micro-lenses. Each of the color filters overlaps two adjacent macro-lenses.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
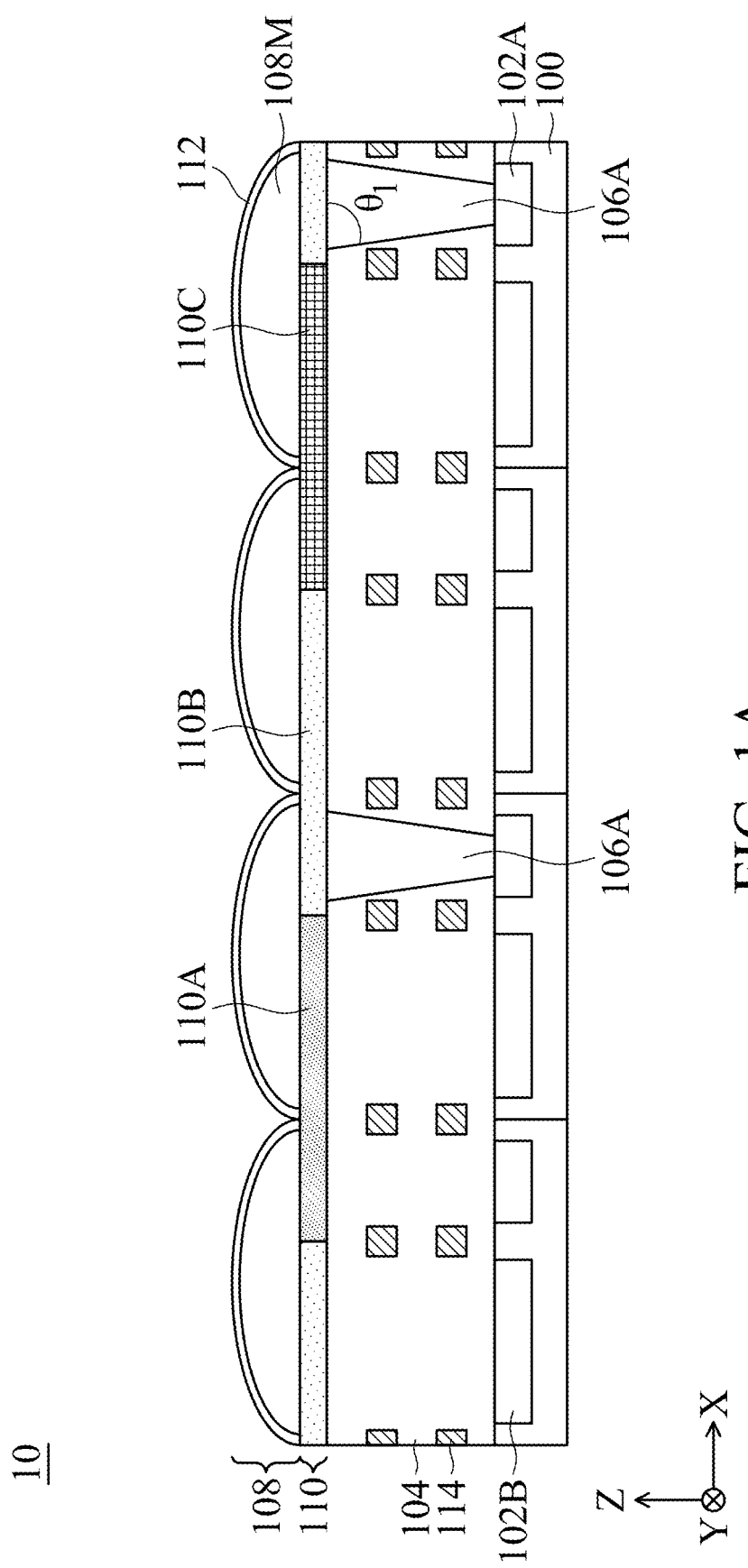
FIGS. 1A-1F are cross-sectional diagrams of an image sensor in accordance h various embodiments of the disclosure.

The image sensor of the present disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments.

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "upper" or "top" are used to describe the position of one element relative to another. It should be appreciated that if a device is flipped upside down, an element that is "lower" will become an element that is "upper".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The terms "about" and "substantially" typically mean +/−10% of the stated value, more typically mean +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the disclosure, high dynamic range (HDR) may be achieved by disposing a light-guiding structure in the interlayer of the image sensor. Specifically, the light-guiding structure with high light transmission may be disposed and above large photodiodes to increase the sensitivity of the large photodiodes, while the light guiding structure with high light attenuation may be disposed and above small photodiodes to decrease the sensitivity of the small photodiodes. Accordingly, a greater sensitivity ratio of the large photodiodes to the small photodiodes may be achieved, thereby realizing better HDR imaging.

Referring to FIG. 1A, FIG. 1A is a cross-sectional diagram of an image sensor 10 in accordance with some embodiments of the disclosure. The image sensor 10 includes a substrate 100, first photodiodes 102A, second photodiodes 102B, an interlayer 104, a light-guiding structure 106A, and a micro-lens layer 108. In some embodiments, the substrate 102 may be, for example, a wafer or a chip, but the present disclosure is not limited thereto. In some embodiments, the substrate 102 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof.

The first photodiodes 102A and the second photodiodes 102B are alternately disposed in the substrate 100. The area of the cross-section of the first photodiodes 102A is smaller than the area of the cross-section of the second photodiodes 102B. Furthermore, from a top view of the image sensor 10 (not shown), the area of each of the first photodiodes 102A is also smaller than the area of each of the second photodiodes 102B.

The interlayer 104 is disposed on the substrate 100. In some embodiments, the interlayer 104 may include an organic transparent material, a dielectric material, a semiconductor material such as silicon, any other suitable transparent material, or a combination thereof. More specifically, the material of the interlayer 104 may have a light transmittance to light with a wavelength in a range from 200 nm to 1100 nm greater than 90%, or preferably greater than 95%. In some embodiments, the dielectric material includes silicon oxide, silicon nitride, silicon oxynitride, any other suitable dielectric material, or a combination thereof. The interlayer 104 may be formed using suitable deposition techniques, such as a spin-on coating process, chemical vapor deposition (CVD), physical vapor deposition (PVD), atomic layer deposition (ALD), other suitable deposition methods, or a combination thereof.

In some embodiments, the extinction coefficient of the interlayer 104 may be between about 0.001 and about 0.01, such as about 0.005. In some embodiments, the refractive index of the interlayer 104 may be between about 1.2 and about 1.8, such as about 1.6.

The light-guiding structure is disposed in the interlayer 104 and over at least one of the first photodiodes 102A or the second photodiodes 102B. In particular, in some embodiments, the light-guiding structure may be disposed over at least one of the first photodiodes 102A only, or may be disposed over at least one of the second photodiodes 102B only. In other embodiments, the light-guiding structure may also be disposed over at least one of the first photodiodes 102A and at least one of second photodiodes 102B. That is, the light-guiding structure may be disposed over one or more of the first photodiodes 102A and one or more of the second photodiodes 102B simultaneously.

According to some embodiments of the disclosure, as shown in FIG. 1A, the light-guiding structure 106A may be disposed in the interlayer 104 and over part of the first photodiodes 102A, but the present disclosure is not limited thereto. It should be noted that other aspects with respect to the arrangement of the light-guiding structure will be described and shown in the following context and figures.

In some embodiments, the light-guiding structure 106A may include an organic material, such as an acrylate polymer. For example, the acrylate polymer may be formed of methyl methacrylate, ethyl methacrylate, N-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentenyl acrylate, dicyclopentanyl acrylate, dicyclopentenyl methacrylate, dicyclopentanyl methacrylate, dicyclopentanyloxyethyl methacrylate, isobornyl methacrylate, cyclohexyl acrylate, 2-methylcyclohexyl acrylate, dicyclopentanyloxyethyl acrylate, isobornyl acrylate, phenyl methacrylate, phenyl acrylate, benzyl acrylate, 2-hydroxyethyl methacrylate, or a combination thereof. Furthermore, the light-guiding structure 106A may further include additional organic materials to adjust the extinction coefficient and the refractive index of the light-guiding structure 106A within the desired range. In some embodiments, the additional organic materials may include propylene glycol alkyl ether acetates, methoxy-containing organic esters, or a combination thereof. For example, the propylene glycol alkyl ether acetates may include propylene glycol methyl ether acetate, propylene glycol ethyl ether acetate, propylene glycol propyl ether acetate and propylene glycol butyl ether acetate, or a combination thereof. For example, the methoxy-containing organic esters may include methyl methoxy acetate, ethyl methoxy acetate, propyl methoxy acetate, butyl methoxy acetate, methyl 2-methoxypropionate, ethyl 2-methoxypropionate, propyl 2-methoxypropionate, butyl 2-methoxypropionate, methyl 3-methoxypropionate, ethyl 3-methoxypropionate, propyl 3-methoxypropionate, butyl 3-methoxypropionate, or a combination thereof.

In some embodiments, the light-guiding structure 106A may be formed by forming openings (not shown) for the light-guiding structure 106A in the interlayer 104 followed by depositing the material of the light-guiding structure 106A using any suitable process, such as a photolithography processes. For example, the photolithography process may include coating, exposure, developing, other suitable processes, or a combination thereof. Then, excess material of the light-guiding structure 106A may be removed using any suitable planarization process, such as chemical mechanical polishing (CMP), such that the top surfaces of the interlayer 104 and the light-guiding structure 106A are level.

It is beneficial to use organic materials for the light-guiding structure 106A since the refractive index or the extinction coefficient of the light guiding structure 106A may be adjusted by altering the amounts of the respective organic materials depending on the design demand. Furthermore, compared with the conventional processes for materials other than organic materials by physical vapor deposition, the complexity of the forming process of the light-guiding structure 106A using the organic materials may be reduced as well.

In addition, in some embodiments, the light-guiding structure 106A may have a rectangular or a trapezoidal shape in the cross-sectional view. Moreover, in some embodiments, an angle $\theta_1$ between the sidewall and the top surface of the light-guiding structure 106A may be between about 65° and about 90°, such as about 75° or about 80°. Given the light-guiding structure 106A with the fixed top surface area, the volume of the light-guiding structure 106A may be tuned by altering the angle $\theta_1$ of the light-guiding structure 106A, thereby adjusting the light attenuation efficiency of the light-guiding structure 106A to achieve desired effect according to the design demand.

In some embodiments, the extinction coefficient of the light-guiding structure 106A may be between about 0.1 and about 0.3, such as about 0.2. The refractive index of the light-guiding structure 106A is greater than the interlayer 104. In some embodiments, the refractive index of the light-guiding structure 106A may be between about 1.4 and about 2.0, such as about 1.7. The light-guiding structure 106A with higher refractive index may enable the incident light to enter the light-guiding structure 106A rather than the interlayer 104 in the proximity of the light-guiding structure 106A. In addition, the light-guiding structure 106A having the extinction coefficient within the above range may decrease the sensitivity of the first photodiodes 102A that is disposed below the light-guiding structure 106A, thereby increasing the sensitivity ratio of the second photodiodes 102B to the first photodiodes 102A and achieving a high dynamic range.

The micro-lens layer 108 is disposed on the interlayer 104. In some embodiments, the micro-lens layer 108 may include a plurality of micro-lenses 108M, and each of the micro-lenses 108M may be disposed over one of the first photodiodes 102A and one of the second photodiodes 102B. In some embodiments, the material of micro-lens layer 108 may a transparent material. More specifically, the material of the micro-lens layer 108 may have a light transmittance to light with a wavelength in a ramie from 200 nm to 1100 nm greater than 90%, or preferably greater than 95%. For example, the material may include epoxy resin, silicone resin, polyurethane, any other applicable material, or a combination thereof. The micro-lens layer 108 may be formed by depositing the material of the micro-lens layer 108 followed by patterning the material of the micro-lens layer 108. The micro-lenses 108M of the micro-lens layer 108 may be formed to have a desired shape, such as a dome shape as shown in FIG. 1A.

Still referring to FIG. 1A, in some embodiments, the image sensor 10 may further include a color filter array 110 disposed between the interlayer 104 and the micro-lens layer 108. The color filter array 110 may have a plurality of color filters 110A, 110B and 110C. As shown in FIG. 1A, in some embodiments, each of the color filters 110A, 110B and 110C may overlap two adjacent micro-lenses 108M in the micro-lens layer 108. Furthermore, in some embodiments, each of the color filters 110A, 110B and 110C may correspond to one of the first photodiodes 102A below one of the micro-lenses 108M and one of the second photodiodes 102B below another one of the micro-lenses 108M that is adjacent to the former one of the micro-lenses 108M. That is, in these embodiments, the arrangement of color filters 110A, 110B and 110C is offset from the arrangement of the micro-lenses 108M such that each of the color filters 110A, 110B and 110C does not correspond to one of the first photodiodes 102A and one of the second photodiodes 102B below the same micro-lens 108M. In the embodiments shown in FIG. 1A, the bottom surface of the light-guiding structure 106A may contact the first photodiodes 102A, and the top surface of the light-guiding 106A may the color filter array 110 as well.

In some embodiments, the color filters 110A, 110B and 110C may have different colors from one another. For example, the color of the color filters 110A, 110B and 110C may be red, green, blue, or white. The color filter a 110 may be formed in sequence by a coating, exposure, and development process at different steps. Alternatively, the color filter array 110 may be formed by ink-jet printing.

Still referring to FIG. 1A, the image sensor 10 may further include a passivation layer 112. The passivation layer 112 may be deposited conformally on the micro-lens layer 108 to cover the entire surface of the respective micro-lens 108M. The material of the passivation layer 112 may be similar to or the same as that of the micro-lens layer 108, which is not repeated herein. However, in some embodiments, the refractive index of the passivation layer 112 may be less than the refractive index of the micro-lens layer 108 so that the incident light may enter the image sensor 10 in a gradual manner. The passivation layer 112 may also protect the micro-lens layer 108.

Still referring to FIG. 1A, the image sensor 10 may further include a wiring layer 114 disposed in the interlayer 104. The wiring layer 114 may be metal wiring lines that interconnect the first photodiodes 102A, the second photodiodes 102B, and the transistors (not shown) with the peripheral circuits and the outside of the device, respectively. In some embodiments, the material of the wiring layer 114 may include silver (Ag), aluminum (Al), gold (Au), copper (Cu), niobium (Nb), nickel (Ni), titanium (Ti), tungsten (W), silver alloy, aluminum alloy, gold alloy, copper alloy, niobium alloy, nickel alloy, titanium alloy, tungsten alloy, or a combination thereof.

As described above, according to the embodiments of the disclosure, the image sensor 10 may include the light-guiding structure 106A disposed in the interlayer 104 and over at least one of the first photodiodes 102A (i.e., small photodiodes). The refractive index of the light-guiding structure 106A is greater than the refractive index of the interlayer 104, and the light-guiding structure 106A may have high light attenuation efficiency. Therefore, the sensitivity of part of the first photodiodes 102A (i.e., small photodiodes) may be reduced, and the sensitivity ratio of the second photodiodes 102B (i.e., large photodiodes) to the first photodiodes 102A may be increased. High dynamic range imaging may be realized using the image sensor 10 provided by the embodiments of the disclosure.

Figure 1B:
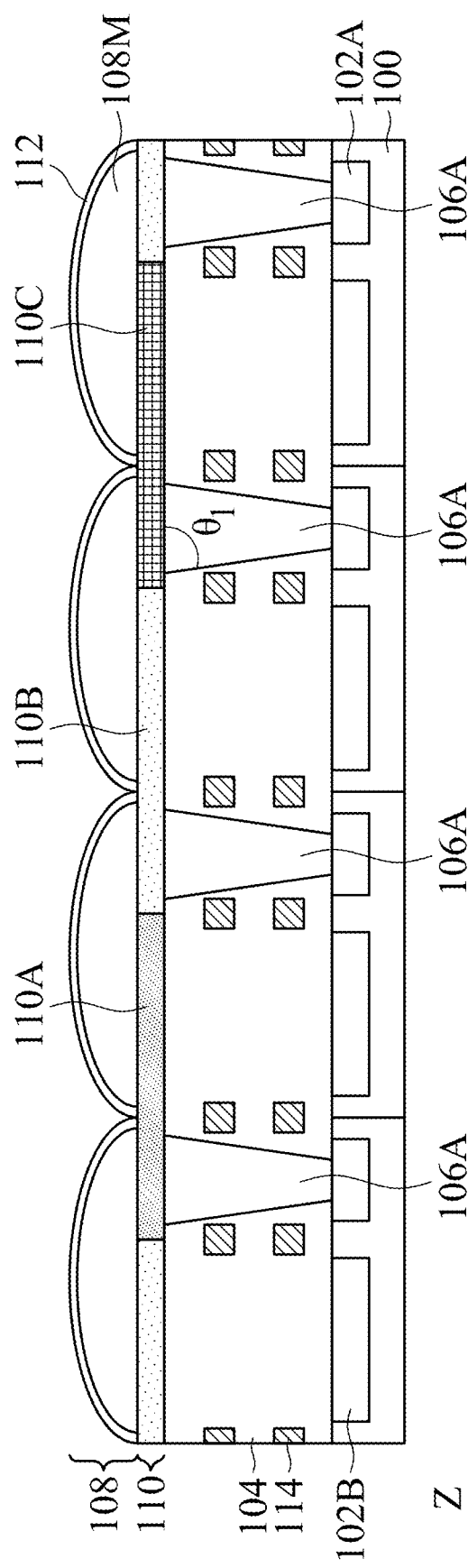

Next, referring to FIG. 1B, FIG. 1B is a cross-sectional diagram of an image sensor 20 in accordance with other embodiments of the disclosure. The image sensor 20 in FIG.

1B is similar to the image sensor 10 in FIG. 1A, except that the light-guiding structure 106A is disposed over all of the first photodiodes 102A. In this way, the sensitivity ratio of the second photodiodes 102B to the first photodiodes 102A may be further increased to achieve better high dynamic range.

Figure 1C:
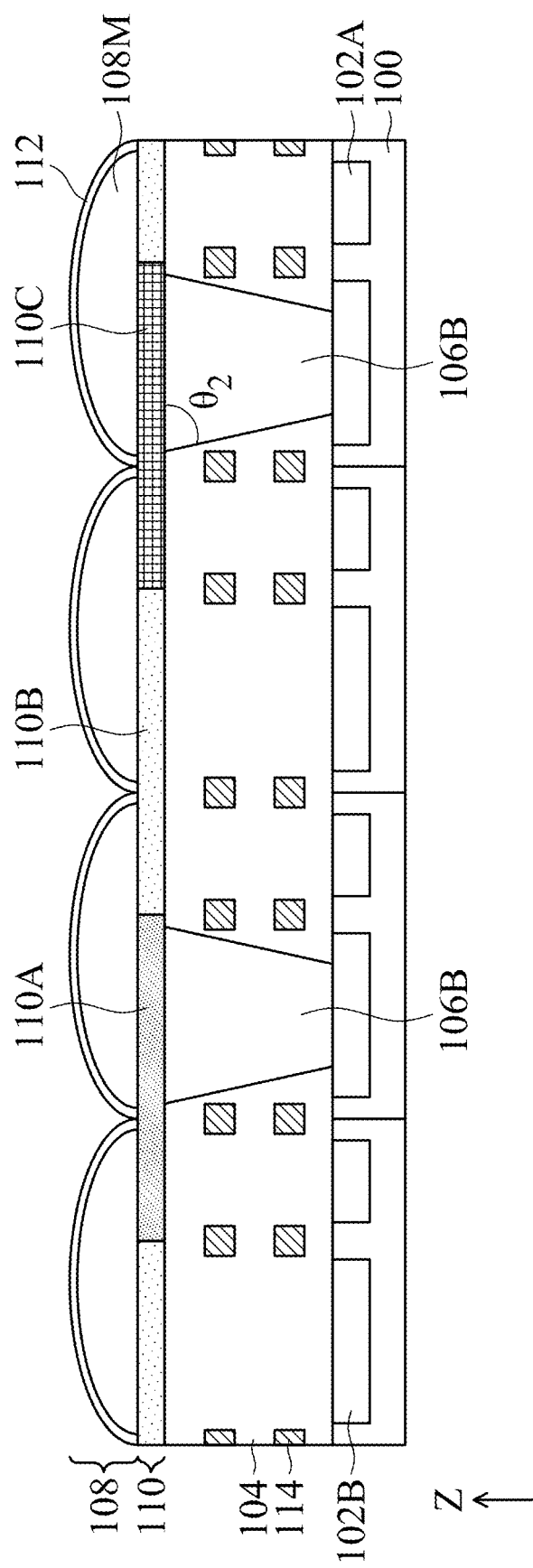

Next, referring to FIG. 1C, FIG. 1C is a cross-sectional diagram of an image sensor 30 in accordance with other embodiments of the disclosure. The image sensor 30 in FIG. 1C is similar to the image sensor 10 in FIG. 1A, except that the image sensor 30 includes the light-guiding structure 106B instead of the light-guiding structure 106A. According to some embodiments of the disclosure, as shown in FIG. 1C, the light-guiding structure 106B may be disposed in the interlayer 104 and over part of the second photodiodes 102B (i.e., large photodiodes). In addition, in some embodiments, the extinction coefficient of the light-guiding structure 106B may be less than the extinction coefficient of the light-guiding structure 106A, and thus the light-guiding structure 106B may have better light transmission efficiency.

In some embodiments, the light-guiding structure 106B may include an organic material, such as a resin polymer. For example, the resin polymer may include an epoxy resin; an acrylic resin such as polymethyl methacrylate (PMMA); various resins such as polydimethylsiloxane (PDMS), polycarbonate (PC), polyester, polyketone, polyurethane, polyimide, polyvinyl alcohol, fluororesin, and polyolefin; or a combination thereof in some specific embodiments, the light-guiding structure 106B may be formed of polydimethylsiloxane (PDMS), polymethyl methacrylate (PMMA), polycarbonate (PC), or a combination thereof. The forming method of the light-guiding structure 106B may be similar to or the same as the forming method of the light-guiding structure 106A, which is not repeated herein.

It is beneficial to use organic materials for the light-guiding structure 106B since the refractive index or the extinction coefficient of the light guiding structure 106B may be adjusted by altering the composition of the organic material depending on the design demand. Furthermore, as described above, compared with the conventional processes for materials other than organic materials by physical vapor deposition, the complexity of the forming process of the light-guiding structure 106B using the organic materials may be reduced as well.

In addition, in some embodiments, the light-guiding structure 106B may have a rectangular or a trapezoidal shape in the cross-sectional view. Moreover, in some embodiments, an angle $\theta_2$ between the sidewall and the top surface of the light-guiding structure 106B may be between about 65° and about 90°, such as about 75° or about 80°. Given the light-guiding structure 106B with the fixed top surface area, the volume of the light-guiding structure 106B may be tuned by altering the angle $\theta_2$ of the light-guiding structure 106B, thereby adjusting the light transmission efficiency of the light-guiding structure 106B to achieve desired effect according to the design demand.

In some embodiments, the extinction coefficient of the light-guiding structure 106B may be between about 0.001 and about 0.01, such as about 0.005. The refractive index of the light-guiding structure 106B is greater than the interlayer 104. In some embodiments, the refractive index of the light-guiding structure 106B may be between about 1.4 and about 2.0, such as about 1.7. The light-guiding structure 106B with higher refractive index may enable the incident light to enter the light-guiding structure 106B rather than the interlayer 104 in the proximity of the light-guiding structure 106B. In addition, the light-guiding structure 106B having the extinction coefficient within the above range may increase the sensitivity of the second photodiodes 102B that is disposed below the light-guiding structure 106B, thereby increasing the sensitivity ratio of the second photodiodes 102B to the first photodiodes 102A and achieving desired high dynamic range.

Figure 1D:
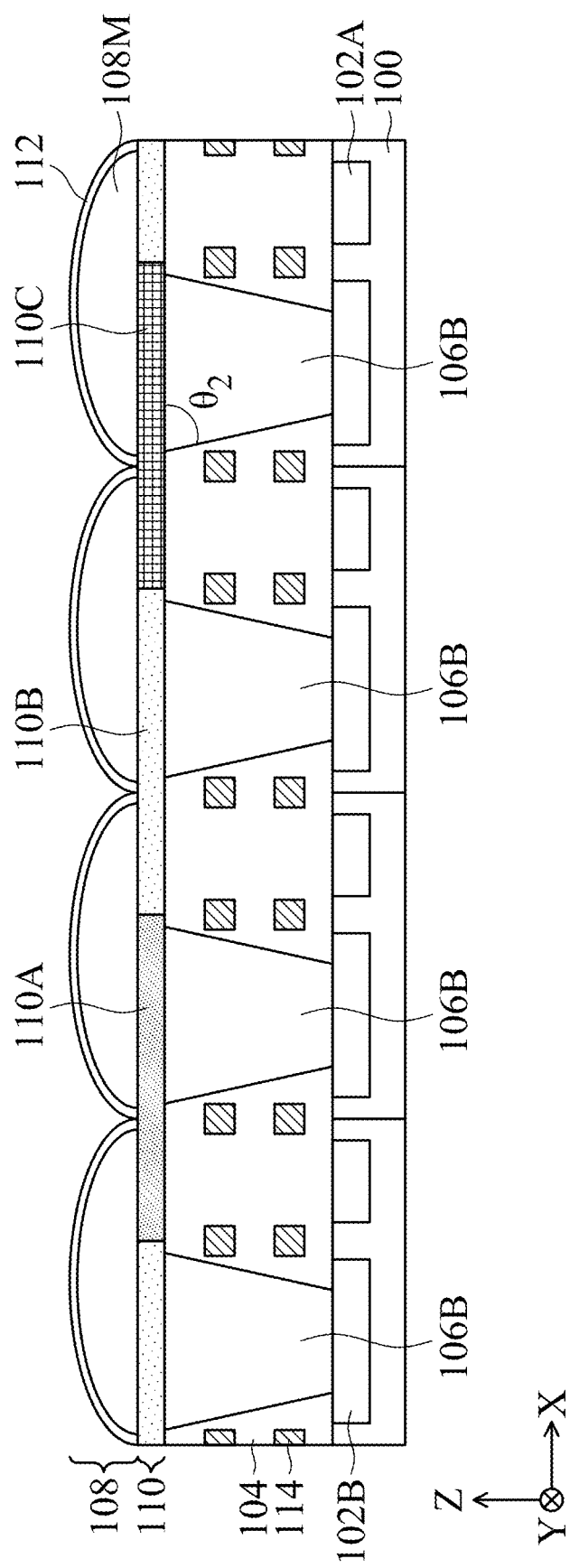

Next, referring to FIG. 1D, FIG. 1D is a cross-sectional diagram of an image sensor 40 in accordance with other embodiments of the disclosure. The image sensor 40 in FIG. 1D is similar to the image sensor 30 in FIG. 1C, except that the light-guiding structure 106B is disposed over all of the second photodiodes 102B. In this way, the sensitivity ratio of the second photodiodes 102B to the first photodiodes 102A may be further increased to achieve better high dynamic range.

Figure 1E:
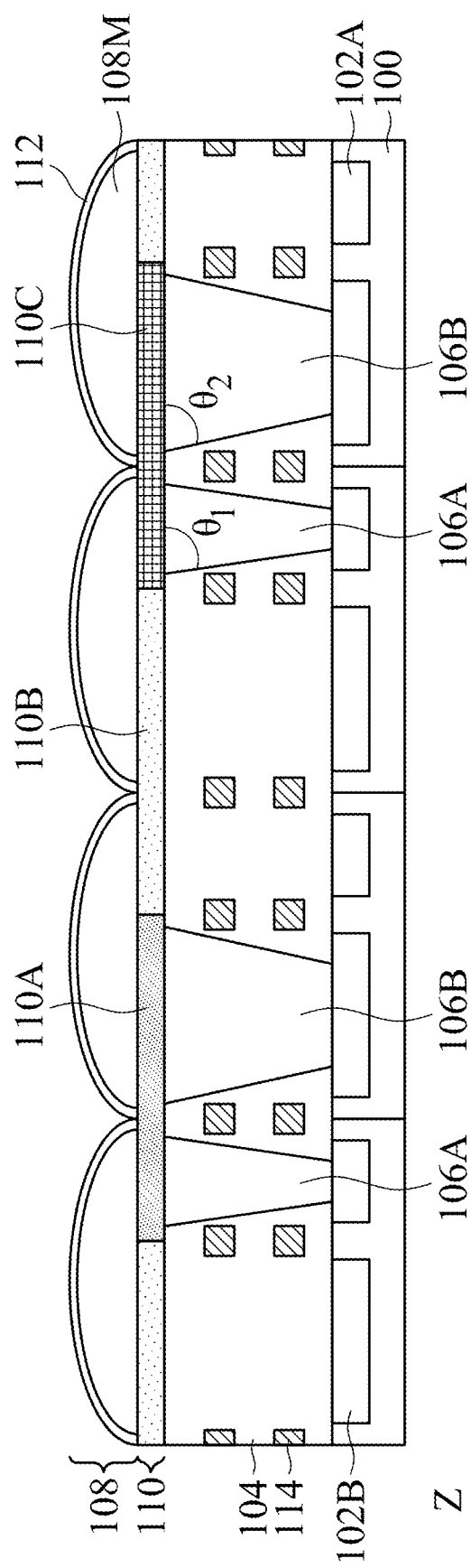

Next, referring to FIG. 1E, FIG. 1E is a cross-sectional diagram of an image sensor 50 in accordance with other embodiments of the disclosure. The image sensor 50 in FIG. 1E is similar to the image sensor 10 in FIG. 1A, except that the image sensor 50 further includes the light-guiding structure 106B. The light-guiding structure 106B may be disposed in the interlayer 104 and over part of the second photodiodes 102B. It should be noted that, in the embodiments shown in FIG. 1E, the light-guiding structures 106A and 106B may be respectively disposed over part of the first photodiodes 102A and part of the second photodiodes 102B below the same color filters. That is, the light-guiding structures 106A and 106B may be disposed below part of the color filters instead of all of the color filters. For example, as shown in FIG. 1E, the light-guiding structures 106A and 106B may be disposed over the first photodiode 102A and the second photodiode 102B below the color filter 110A and/or 110C, whereas the light-guiding structures 106A and 106B may not be disposed over the first photodiode 102A and the second photodiode 102B below the color filter 110B.

By disposing the light-guiding structures 106A and 106B over part of the first photodiodes 102A and part of the second photodiodes 102B simultaneously, the sensitivity of the first photodiodes 102A may be reduced, and the sensitivity of the second photodiodes 102B may be increased. Therefore, the sensitivity ratio of the second photodiodes 102B to the first photodiodes 102A may be increased to achieve better high dynamic range.

Figure 1F:
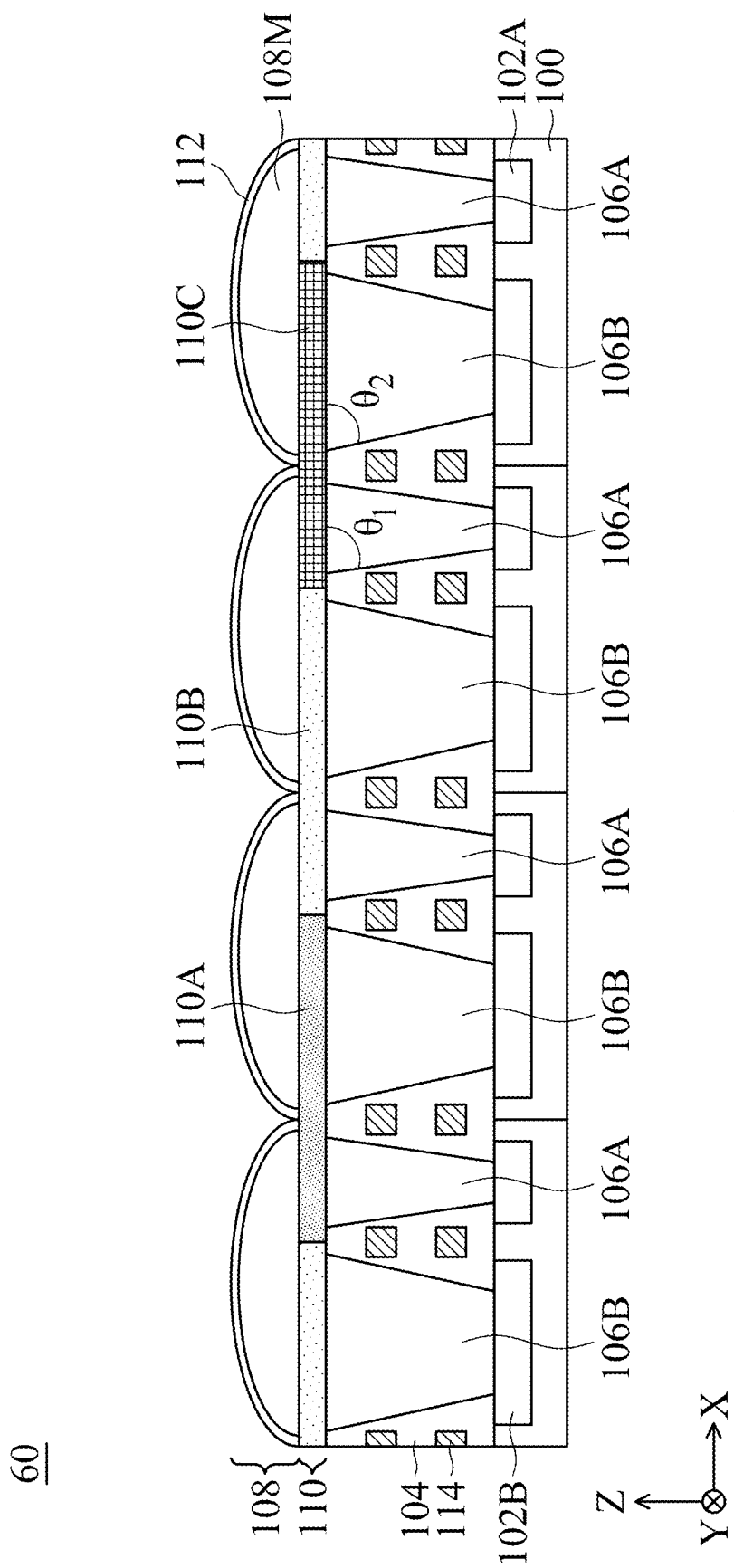

Next, referring to FIG. 1F, FIG. 1F is a cross-sectional diagram of an image sensor 60 in accordance with other embodiments of the disclosure. The image sensor 60 in FIG. 1F is similar to the image sensor 50 in FIG. 1E, except that the light-guiding structures 106A and 106B are disposed over all of the first photodiodes 102A and second photodiodes 102B. Meanwhile, the light-guiding structures 106A and 106B may be disposed below all of the color filters 110A, 110B, and 110O. By this way, the sensitivity ration of the second photodiodes 102B to the first photodiodes 102A may be further increased, thereby providing better high dynamic range.

Figure 2A:
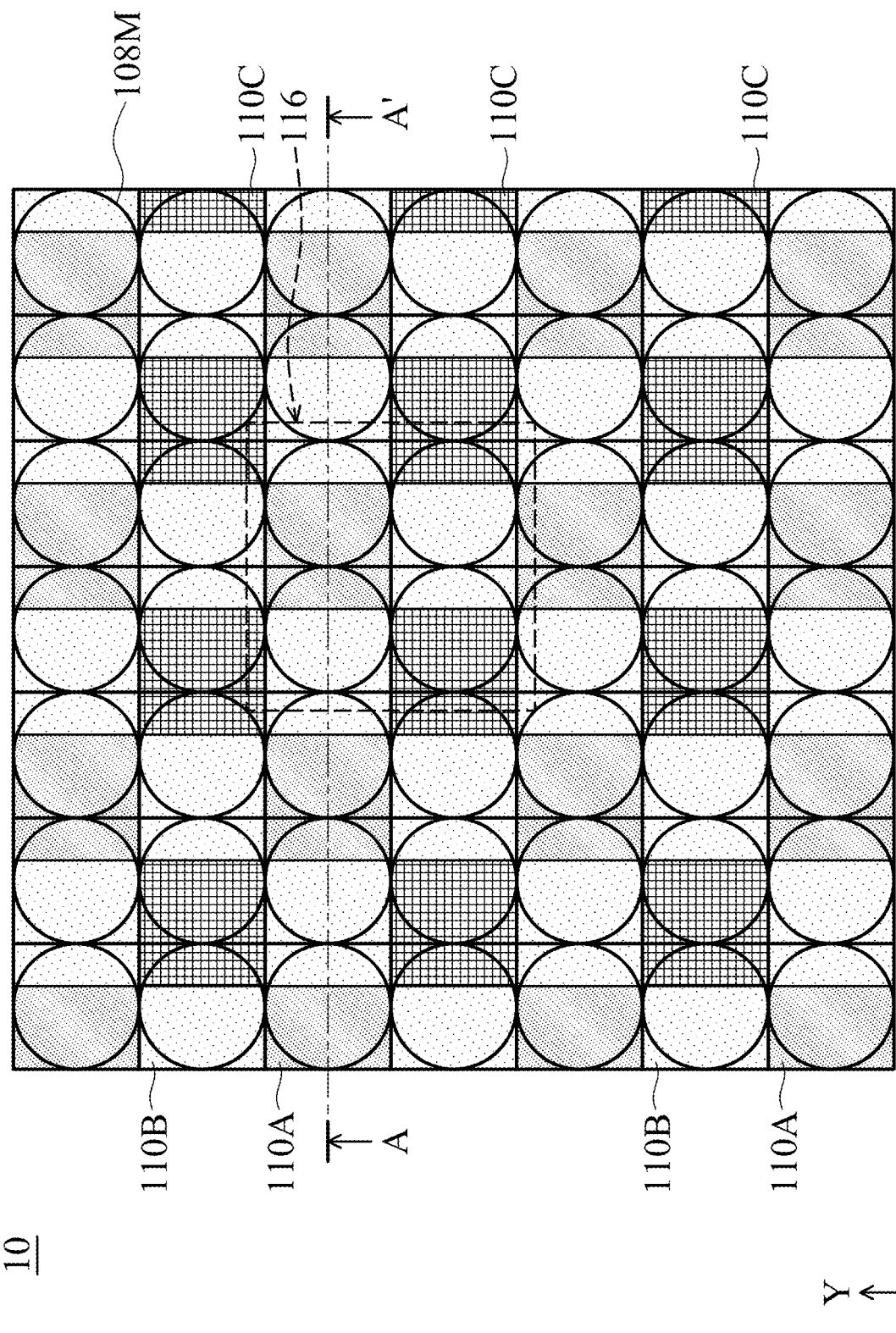
FIG. 2A is a top view diagram of an image sensor in accordance with some embodiments of the disclosure.
Figure 2B:
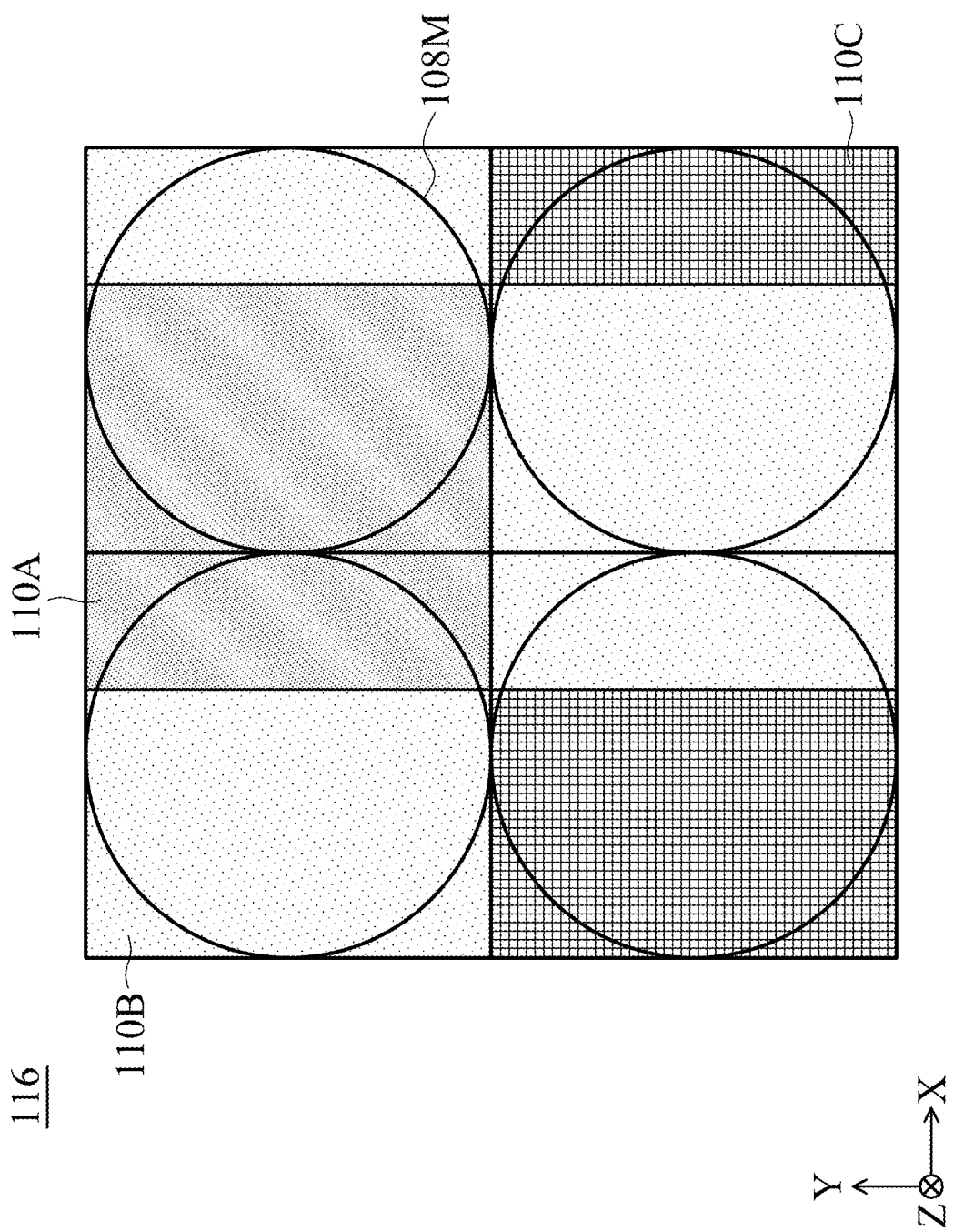
FIG. 2B is an enlarged top view diagram of an image sensor in accordance with some embodiments of the disclosure.

Referring to FIGS. 2A and 2B, FIG. 2A is a top view diagram of an image sensor 10 in accordance with some embodiments of the disclosure, and FIG. 2B is an enlarged top view diagram of an image sensor in accordance with some embodiments of the disclosure. It should be noted that the cross-sectional diagrams of FIG. 1A is taken along the line A-A' in FIG. 2A. In addition, in FIGS. 2A and 2B, the passivation layer 112 is omitted merely for brevity.

In some embodiments, as shower in FIG. 2A, the image sensor 10 may be formed of a minimum repeating unit 116. The minimum repeating unit 116 may be a sensor array defined by four acro-lenses 108M that are arranged in 2×2.

The enlarged diagram of the minimum repeating unit 116 is shown in FIG. 2B. In some embodiment, the color filters 110A, 110B, and 110C may have a rectangular shape, a square shape, or a combination thereof. As shown in FIG. 2B, in the minimum repeating unit 116, the color filter 110A has a square shape, the color filter 110B has a rectangular shape or a square shape, and the color filter 110C has a rectangular shape, but the present disclosure is not limited thereto. In other embodiments where the minimum repeating unit 116 is defined by other micro-lenses 108M arranged in 2×2, the color filter 110A may also have a rectangular shape, and the color filter 110C may also have a square shape.

As described previously, in FIG. 2B, each of the color filters 110A, 110B, and 110C may overlap two adjacent micro-lenses 108M. In addition, any two adjacent color filters 110A, 110B, and 110C may have different colors.

In summary, according to some embodiments of the disclosure, the image sensor may include light-guiding structure disposed over at least one of the first photodiodes (i.e., small photodiodes) or second photodiodes (i.e., large photodiodes). More specifically, the light-guiding structure with high light transmission may be disposed in the interlayer and above large photodiodes to increase the sensitivity of the large photodiodes, and the light guiding structure with high light attenuation may be disposed in the interlayer and above small photodiodes to decrease the sensitivity of the small photodiodes. Accordingly, greater sensitivity ratio of the large photodiodes to the small photodiodes may be achieved, and image sensors with higher sensitivity ratio may realize HDR imaging.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An image sensor, comprising:
a substrate having a plurality of imaging sections;
first photodiodes and second photodiodes alternately disposed in the substrate, wherein one of the first photodiodes and one of the second photodiodes are provided in each of the plurality of imaging sections, wherein an area of each of the first photodiodes is less than an area of each of the second photodiodes from a top view;
an interlayer disposed on the substrate;
a light-guiding structure disposed in the interlayer and directly on at least one of the first photodiodes or the second photodiodes, wherein a refractive index of the light-guiding structure is greater than a refractive index of the interlayer;
a micro-lens layer disposed on the interlayer; and
a color filter array having a plurality of color filters disposed between the interlayer and the micro-lens layer, wherein each of the color filters overlaps only a first photodiode disposed in a first one of the plurality of imaging sections and a second photodiode disposed in a second one of the plurality of imaging sections that is adjacent to the first one of the plurality of imaging sections.

2. The image sensor as claimed in claim 1, wherein an angle between a sidewall and a top surface of the light-guiding element is between 65° and 90°.

3. The image sensor as claimed in claim 1, wherein the light-guiding structure has a rectangular or a trapezoidal shape in a cross-sectional view.

4. The image sensor as claimed in claim 1, wherein the light-guiding structure is disposed over at least one of the first photodiodes.

5. The image sensor as claimed in claim 4, wherein an extinction coefficient of the light-guiding structure is between 0.1 and 0.3, and the refractive index of the light-guiding structure is between 1.4 and 2.0.

6. The image sensor as claimed in claim 1, wherein the light-guiding structure is disposed over at least one of the second photodiodes.

7. The image sensor as claimed in claim 6, wherein an extinction coefficient of the light-guiding structure is between 0.001 and 0.01, and the refractive index of the light-guiding structure is between 1.4 and 2.0.

8. The image sensor as claimed in claim 1, wherein the light-guiding structure is disposed over at least one of the first photodiodes and at least one of the second photodiodes.

9. The image sensor as claimed in claim 8, wherein:
the refractive index of the light-guiding structure is between 1.4 and 2.0;
the light-guiding structure disposed over the at least part of the first photodiodes has an extinction coefficient is between 0.1 and 0.3; and
the light-guiding structure disposed over the at least part of the second photodiodes has an extinction coefficient is between 0.001 and 0.01.

10. The image sensor as claimed in claim 1, wherein the micro-lens layer comprises a plurality of micro-lenses, and each of the micro lenses is disposed over one of the first photodiodes and one of the second photodiodes.

11. The image sensor as claimed in claim 10, wherein each of the color filters overlaps two adjacent micro-lenses.

12. The image sensor as claimed in claim 11, wherein each of the color filters corresponds to one of the first photodiodes below one of the micro-lenses and one of the second photodiodes below another one of the micro-lenses that is adjacent to the one of the micro-lenses.

13. The image sensor as claimed in claim 11, wherein any two adjacent color filters have different colors.

14. The image sensor as claimed in claim 11, wherein the plurality of color filters have a rectangular shape, a square shape, or a combination thereof from a top view.

15. The image sensor as claimed in claim 1, further comprising a passivation layer disposed on the micro-lens layer.

16. An image sensor, comprising:
a substrate having a plurality of imaging sections;
first photodiodes and second photodiodes alternately disposed in the substrate, wherein one of the first photodiodes and one of the second photodiodes are provided in each of the plurality of imaging sections, and an area of each of the first photodiodes is less than an area of each of the second photodiodes from the top view;

an interlayer disposed on the substrate;

a light-guiding structure disposed in the interlayer and over at least one of the first photodiodes or the second photodiodes;

a color filter array having a plurality of color filters disposed on the interlayer; and a micro-lens layer disposed on the color filter array, wherein the micro-lens layer comprises a plurality of micro-lenses each provided on a corresponding one of the plurality of imaging sections, and wherein each of the color filters only partially overlaps each of two adjacent micro-lenses, and overlaps only a first photodiode disposed in a first one of the plurality of imaging sections and a second photodiode disposed in a second one of the plurality of imaging sections that is adjacent to the first one of the plurality of imaging sections.

17. The image sensor as claimed in claim 16, wherein a refractive index of the light-guiding structure is greater than a refractive index of the interlayer.

18. The image sensor as claimed in claim 16, wherein any two adjacent color filters have different colors.

19. The image sensor as claimed in claim 1, wherein a top surface of the interlayer and a top surface of the light-guiding structure are levelled.

\* \* \* \* \*